United States Patent
Ehbets et al.

(10) Patent No.: US 6,545,808 B1
(45) Date of Patent: Apr. 8, 2003

(54) PHASE MASK WITH SPATIALLY VARIABLE DIFFRACTION EFFICIENCY

(75) Inventors: Peter Ehbets, Heerbrugg (CH); Michel Poirier, Beauport (CA); Zhihong Xu, St-Laurent (CA); Nadia Capolla, Ste-Geneviève (CA)

(73) Assignees: Institut National d'Optique, Quebec (CA); StockerYale Canada Inc., Quebec (CA)

( * ) Notice: Subject to any disclaimer, the term of this patent is extended or adjusted under 35 U.S.C. 154(b) by 0 days.

(21) Appl. No.: 09/403,678
(22) PCT Filed: Feb. 11, 1998
(86) PCT No.: PCT/CA98/00112
§ 371 (c)(1),
(2), (4) Date: Feb. 10, 2000
(87) PCT Pub. No.: WO98/36297
PCT Pub. Date: Aug. 20, 1998

(30) Foreign Application Priority Data

Feb. 14, 1997 (CA) .............................................. 2197706

(51) Int. Cl.$^7$ ............................ G02B 27/44; G02B 5/18
(52) U.S. Cl. ................... 359/566; 359/569; 359/570; 359/574; 359/575; 359/15; 359/34; 385/37
(58) Field of Search ................... 385/37, 130; 359/8, 359/15, 34, 130, 569, 570, 574, 575

(56) References Cited

U.S. PATENT DOCUMENTS

| | | | |
|---|---|---|---|
| 4,936,665 A | 6/1990 | Whitney | 350/451 |
| 5,327,515 A | 7/1994 | Anderson et al. | 385/123 |
| 5,367,588 A | * 11/1994 | Hill | 385/37 |
| 5,367,758 A | 11/1994 | Hill et al. | 385/37 |
| 5,413,884 A | 5/1995 | Koch et al. | 430/5 |
| 5,587,815 A | 12/1996 | Sato et al. | 359/11 |
| 6,313,473 B1 | * 11/2001 | Lin | 385/37 |

FOREIGN PATENT DOCUMENTS

| | | | |
|---|---|---|---|
| CA | 1298724 | 4/1992 | .................. 88/116 |
| EP | 0632295 | 1/1995 | ............ G02B/5/18 |

OTHER PUBLICATIONS

J.J.Pan and Y.Shi, "Steep skirt fibre Bragg grating fabrication using a new apodised phase mask", Electronics Letters, 33(22), pp. 1895–1896(Oct. 1997).*

J.J.Pan et al., "Effective apodized phase mask for optimum FBGs", CLEO/Europe, pp. 359(1998).*

X.Liu et al., "Realization of geometrically apodized phase masks for the production of apodized fiber gratings by UV exposure", CLEO'98, pp. 514–515(1998).*

K.O. Hill et al., Appl. Phys. Lett., 62, pp. 1035–1037 (1993).

M. Matsuhara and K.O. Hill, Appl. Opt., 13, pp. 2886–2888 (1974).

(List continued on next page.)

*Primary Examiner*—Thong Nguyen
*Assistant Examiner*—Leo Boutsikaris
(74) *Attorney, Agent, or Firm*—Merchant & Gould P.C.

(57) ABSTRACT

A phase mask (15) for modulating a collimated light beam passing therethrough, the light beam being diffracted to photoinduce a refractive index profile in a photosensitive optical medium, the phase mask (15) comprises a substrate (17) having an outer surface provided with a plurality of parallel grating corrugations (19). The grating corrugations (19) have a non-uniform relief depth across the outer surface for photoinducing a non-uniform refractive index profile in the photosensitive optical medium. The non-uniform relief depth is defined by a variable thin film layer (21) of variable thickness overlaying the substrate (17). The grating corrugations (19) can either be etched into the variable thin film layer (21) itself or be etched into the substrate (17), with the variable this film layer (21) being deposited on it after etching. Methods to make such phase masks are also provided.

7 Claims, 11 Drawing Sheets

OTHER PUBLICATIONS

I. Bennion et al., "UV–written in–fibre Bragg gratings", *Tutorial review, Optical and Quantum Electronics 28*, pp. 93–135 (1996).

B. Malo et al. "Apodised in–fibre Bragg grating reflectors photoimprinted using a phase mask", Electr. Lett. $2^{nd}$ Feb. 1995, vol. 31, No. 3, pp. 223–224.

J. Martin and F. Ouellette, "Novel writing technique of long and highly reflective in–fibre gratings", Electr. Lett., 30, 811–812 (1994).

M. J. Cole et al., "Moving fibre/phase mask–scanning beam technique for enhanced flexibility in producing fibre grating with uniform phase mask", Electr. Lett., 31, 1488–1490 (1995).

J. Albert et al., "Apodisation of the spectral response of fibre Bragg gratings using a phase mask with variable diffraction efficiency", Electr. Lett. $2^{nd}$ Feb. 1995, vol. 31, No. 3, pp. 222–223.

T. Kjellberg et al., Jour. Lightwave Technol., 10, pp. 1256–1266 (1992).

A. Swanton et al., "Use of e–beam written, reactive ion etched, phase masks for the generation of novel photorefractive fibre gratings", Microelectronic Engineering 30, 509–512 (1996).

M. J. Verheijen, "E–beam lithography for digital holograms", Jour. of Mod. Opt., 40, 711–721 (1993).

A. Mitreiter et al., "Apodized diffraction grating as outcoupling element for 1.06 μm Nd:YAG laser", OSA Technical Digest Series vol. 11, *Diffractive Optics: Design, Fabrication, and Application*, Rochester, 1994, pp. 282–285.

G. Bostanjoglo et al., "Improvement of power–Laser characteristics with optimized gradient reflectivity mirrors", Laser und Optoelektronik 28(4), 1996, pp. 51–61.

R. Grunwald et al., "Microlens arrays formed by crossed thin–film deposition of cylindrical microlenses", OSA Technical Digest Series vol. 5, *Diffractive and micro–optics*, OSA Technical Digest Series vol. 5, *Diffractive and micro–optics*, Boston, 1996, pp. 27–30.

M. Plante, C. Paré, P.A. Bélanger, Y. Champagne, J.M. Trudeau, M. Morin and P Ehbets, "Laser beam variance measurements using a parabolic transmission filter", SPIE vol. 2870, pp. 22–30.

Georg Hass et Noel W. Scott, "On the Structure and Properties of some metal and metal oxide films", Journal de Physique et le Radium, vol. 11(7) 394–402 (1950) pp. 72–80.

C. Zizzo et al. "Fabrication and characterization of tuned Gaussian mirrors for the visible and the near infrared", Optics Letters vol. 13, No. 5, May 1988.

G. Emiliani, et al., "Optical coatings with variable reflectance for laser mirrors", Applied Optics, vol. 28, No. 14, Jul. 15, 1989, pp. 2832–2837.

R. Kashyap, et al. "Simple technique for apodising chirped and unchirped fibre Bragg gratings", Electr. Lett. $20^{th}$ Jun. 1996, vol. 32, No. 13, pp. 1226–1228.

K.O. Hill, et al., "Bragg gratings fabricated in monomode photosensitive optical fiber by UV exposure through a phase mask", Appl. Phys. Lett. 62 (10), Mar. 8, 1993, pp. 1035–1037.

W. Heitmann, "Reactive Evaporation in Ionized Gases", Applied Optics, vol. 10(11) 2414–2418, (1971) pp. 201–206.

R.F. Bunshah and A.C. Raghuram, "Activated Reactive Evaporation process for High Rate Deposition of Compounds", Journal of Vacuum Science and Technology, vol. 9(6) 1385–1388 (1972) pp. 207–245.

P.J. Martin, "Review Ion–based methods for optical thin film deposition", Journal of Materials Science, vol. 21, 1.25 (1986) pp. 260–283.

Karl H. Guenther, "Microstructure analysis of thin films deposited by reactive evaporation and by reactive ion–plating", SPIE vol. 1019, Thin Film Technologies III (1988) pp. 73–83.

Hans K. Pulker, "Modern Optical Coating Technologies" SPIE vol. 1019, Thin Film Technologies III (1988) pp. 138–147.

* cited by examiner

PHASE MASK WITH SPATIALLY VARIABLE DIFFRACTION EFFICIENCY

FIELD OF THE INVENTION

The present invention relates to optical elements for the fabrication of diffraction gratings. More particularly, it relates to a non-uniform or apodized phase mask used for recording Bragg gratings or other high spatial frequency grating structures into an optical medium, the gratings having an apodized profile.

BACKGROUND OF THE INVENTION

Already known in prior art, there is a uniform phase mask, which is a phase diffraction grating usually recorded in photoresist and then etched in a bulk substrate as a one-dimensional periodic surface-relief pattern. Phase masks are generally used in transmission to record Bragg gratings in the core of photosensitive optical fibers or on optical waveguides. The use of a phase mask significantly decreases the coherence requirements on the writing laser in comparison to holographic direct writing techniques. Ultraviolet (UV) light is usually used to imprint a Bragg grating into fibers or in photoresist, and therefore the phase mask material is preferably transparent to UV illumination.

The phase mask technique is described in U.S. Pat. No. 5,367,588 (HILL et al.). Hill discloses a method of fabricating Bragg gratings in the interior of a photosensitive optical waveguide comprising disposing a silica glass phase grating mask adjacent and parallel to the optical waveguide, and applying a single collimated light beam through the mask to said medium. The grating on the mask is so designed that the power in the transmitted zero diffraction order beam is minimized (in general to less than 5% of the light diffracted by the mask) and the diffracted power in the plus and minus first transmitted diffraction orders is maximized (each typically contain more than 35% of the incident light) over the entire grating surface. When illuminated at normal incidence with coherent or partially coherent light, the phase mask produces in its near-field a self-interference between the first order diffracted beams. This interference fringe pattern will have a spatial frequency that is twice the spatial frequency of the phase mask, and will be photo imprinted in the photosensitive medium placed in close proximity of the phase mask grating.

A variation of the above phase mask geometry, which uses off-normal illumination and the interference of the transmitted zero and minus-first diffraction orders, is also possible with small period phase masks and is disclosed in U.S. Pat. No. 5,327,515 (ANDERSON et al.) and U.S. Pat. No. 5,413,884 (KOCH et al.). In this case, the phase mask and the generated interference pattern have the same periodicity. If the phase mask period $\Lambda$ has a size within the interval $0.5\lambda < \Lambda < 1.5\lambda$, where $\lambda$ designates the readout wavelength in the medium, the phase mask generates, at incidence angles close to the Bragg angle, only the transmitted zero and minus-first diffraction orders. Since no diffraction orders have to be suppressed, the fabrication tolerances for the grating shape are less severe compared to the previous approach. This off-axis geometry has been proposed in the Anderson patent for the recording of Bragg gratings in an optical medium, and the Koch patent discloses a method of making such a mask.

Traditional phase masks comprise a uniform one-dimensional grating structure of constant period and relief depth, allowing for a constant diffraction efficiency of the mask. This generates a uniform periodic modulation of the refractive index in the photosensitive medium. The resulting device acts as a Bragg filter. Typically the Bragg spectral response will be a narrow-band reflectivity peak of nearly 100% at the design wavelength, accompanied by a series of sidelobes at adjacent wavelengths. The calculated reflectivity spectrum of a uniform Bragg grating is shown in FIG. 1 (prior art). It is important to reduce the reflectivity of the sidelobes in the Bragg response in devices where cross-talk cannot be tolerated, such as in devices for wavelength demultiplexing applications. Bragg gratings with reduced sidelobes in their spectral response can be achieved by recording an index modulation with a spatially varying modulation amplitude (see for example M. Matsuhara and K. O. Hill, Appl. Opt., 13, pp. 2886–2888 (1974) and I. Bennion et al., "UV-written in-fibre Bragg gratings", Tutorial review, optical and Quantum Electronics 28, pp. 93–135 (1996)). This generates a Bragg grating with a spatially varying coupling efficiency, which is called apodized. The condition for an efficient sidelobe suppression is that the modulation level decreases continuously to zero at both limits of the Bragg grating. Appropriate apodization profiles for this task are for example Gaussian, Blackman or Hamming functions or one period of the $\cos^2$ function (see for example D. Pastor et al., Journal of lightwave Technology, vol 14, no 11, pp. 2581–2588 (1996)).

Different approaches have been investigated to realize Bragg gratings generating a spectral response without sidelobes, with or without the use of a phase mask. Most of these approaches are variations based on three methods which will be described and discussed below.

The first of these methods concerns the use of a beam-profile shaping filter. In this approach, the intensity profile of the recording beams is appropriately shaped by means of absorptive, diffractive or Fabry-Perot apodizing filters, in order to generate the desired index modulation in the recording medium. Beam-shaping filters can be placed in the single beam incident on a uniform phase mask or in the two recording beams required for direct holographic writing in the fiber. However, with the beam-shaping filter technique, two successive recording steps with different filters have to be applied, in order to generate a narrow-bandwidth spectral Bragg response without sidelobes. The first step produces the periodic index modulation profile, whereas the second step compensates variations of the average refractive index in the recording medium, which is necessary to generate a single reflected Bragg wavelength (B. Malo et al. "Apodised in-fibre Bragg grating reflectors photo imprinted using a phase mask", Electr. Lett. Feb. 2, 1995, Vol. 31, No. 3, pp. 223–224).

The main drawback of the beam-shaping filter technique is that it is time consuming, difficult to use and therefore not appropriate for industrial production. It implies having to perform two exposure steps. The first exposure with apodized beams will induce the desired index modulation profile, but without a second exposure the local average refractive index will also vary, introducing an unwanted chirp. It is therefore necessary to expose a second time with a compensated beam to equalize the average refractive index. This second exposure step needs very precise alignment with respect to the first exposure. In addition, it is difficult to calibrate, since the response of the recording medium changes after the first exposure. Therefore, the final response of the Bragg grating is difficult to control in practice.

A second approach to write a Bragg grating having a reflection response with reduced apodized secondary maxima is the scanning beam technique. Variable exposure energies can be achieved by scanning focused beams or a slit mask in the recording beams with respect to the recording medium. The exposure energy is locally controlled by varying either the scanning speed or the optical power of the recording beams. The technique can be applied to recording with a single uniform phase mask or to direct holographic writing. As with the apodizer technique, two successive recording steps are required to generate a selective apodized Bragg grating (see J. Martin and F. Ouellette, "Novel writing technique of long and highly reflective in-fibre gratings", Electr. Lett., 30, 811–812 (1994)). An interesting implementation of this technique has been proposed in M. J. Cole et al. "Moving fibre/phase mask-scanning beam technique for enhanced flexibility in producing fibre gratings with uniform phase mask", Electr. Lett., 31, 1488–1490 (1995). It is shown that pure apodization is achieved by either applying a variable spatial oscillation to the fiber or by slowly moving it relative to the uniform phase mask as the writing beam is scanned. This technique modifies locally the contrast of the recorded interference pattern but does not affect the average recording intensity. Therefore, only a single scanning exposure is required. Another variation is to apply a symmetric longitudinal stretching of the fiber around the center of the grating while the grating is being written, as discussed in R. Kashyap, A. Swanton and D. J. Armes, "Simple technique for apodising chirped and unchirped fibre Bragg gratings", Electr. Lett., 32(13), June 1996, pp 1226–1228.

The scanning beam technique is however a sequential recording process which is time-consuming and therefore not appropriate for the production of apodized spectral response Bragg gratings. In the case of two exposure steps, the same arguments as for the beam-shaping filter technique apply and are responsible for a difficult process control. The improved scanning technique of the above mentioned reference from M. J. Cole et al. requires sophisticated automated positioning equipment which is able to apply a controlled dither to the fiber or the uniform phase mask, while the writing beam is scanned. For each position of the scanning beam, the movement applied to the phase mask or fiber must be carefully controlled to have a specific frequency and amplitude, in order to generate the desired variation of the local diffraction efficiency. The same difficulty arises in the stretching technique of Kashyap et al. where the stretch induced by two piezo-translators must be carefully calibrated. In practice the resulting apodized spectral response of the recorded Bragg grating is very difficult to predict.

A final approach to sidelobes reduction is the use of a non-holographic apodized phase mask. This technique has been proposed in the paper from J. Albert et al., "Apodisation of the spectral response of fibre Bragg gratings using a phase mask with variable diffraction efficiency", Electr. Lett. Feb. 2, 1995, Vol. 31, No. 3, pp. 222–223. It applies a single recording step with an apodized phase mask of variable diffraction efficiency. The apodized phase mask with variable diffraction efficiency is fabricated by direct writing in silica with a focused ion beam followed by differential wet etching. The first orders diffraction efficiency apodization can be performed by varying spatially the grating relief depth, the line width or both parameters at the same time.

The apodized phase mask technique is the most appropriate technique for the production of apodized grating structures. It generates the apodized grating with a single exposure which enables high reproducibility and short fabrication times. However, the apodized phase mask structure proposed in the Albert et al. reference suffers from several severe drawbacks.

The proposed apodized phase mask is fabricated by applying direct-write technologies which can use either a focused electron, ion or laser beam as source. The direct-write method has the advantage of being flexible because the grating is written one line at a time, or one writing field at a time. Thus, the implementation of complex apodization profiles is straight forward. Preferentially, the variable diffraction efficiency of the phase mask grating is realized by modulating the line width of the grating structure. Then, a binary surface relief is obtained in resist which can be transferred in the substrate by standard binary selective etching technology. Unfortunately, direct writing is a sequential fabrication process and the realization of large surface phase masks, as required for fiber Bragg grating printing and photolithography on wafers for batch processing of optical waveguide devices, is time consuming and expensive. Furthermore, direct writing introduces position errors in the ideal grating structure which influence strongly the spectral response of uniform and apodized Bragg gratings. FIG. 2 (prior art) shows the typical reflectivity spectrum of an apodized fiber grating realized with a direct electron-beam written phase mask (direct-write fabrication errors are discussed in T. Kjellberg et al., Jour. Lightwave Technol., 10, pp. 1256–1266 (1992), A. Swanton et al., "Use of e-beam written, reactive ion etched, phase masks for the generation of novel photorefractive fibre gratings", Microelectronic Engineering 30, 509–512 (1996), and M. J. Verheijen, "E-beam lithography for digital holograms", Jour. of Mod. Opt., 40, 711–721 (1993)). Two different error contributions can be distinguished. As the writing beam changes from one writing field to another, misalignment problems cause overlap or spacing between the exposed fields. These position errors are called stitching errors and contain in general a systematic contribution. Systematic stitching errors are intolerable for apodized Bragg gratings, since they produce important sidelobes in the spectral Bragg response based on Fabry-Perot interference effects (FIG. 2). In addition, random position errors distributed stochastically along the grating lines of the phase mask are generated. As shown in FIG. 2, random errors lead to a considerable increase of the noise-level outside of the Bragg peak.

Since wavelength demultiplexing devices in optical telecommunication require noise-free Bragg responses without any sidelobes, high-quality apodized phases masks cannot be realized by direct-write technologies. Therefore there is presently a need for an improved method of making apodized phase masks Holography is a well known alternative method for fabricating phase masks. In this method, the sinusoidal interference pattern of two coherent optical beams is first recorded in photoresist as a surface-relief hologram which is then transferred in the substrate medium by etching. Holography is a parallel writing process and is therefore appropriate to the realization of large surface area phase masks. In addition, optical,wavefronts can be generated very accurately over large surfaces by using conventional lenses or mirrors. As a result, the holographically recorded grating pattern is free from any positioning errors and a sub-Angstrom grating precision on the grating period over the entire grating surface is conventionally achieved. Therefore, holography is a promising fabrication technology for apodized phase masks generating Bragg gratings with ideal, noise-free spectral responses.

However, generating a phase mask of spatially varying diffraction efficiency with holographic recording is not an easy task. As already stated above, an efficiency modulation can be achieved by varying the grating relief depth or the line width. A precise local variation of the grating line width, as achievable with direct writing, is difficult to implement holographically and therefore not recommended for commercial applications.

Therefore, the efficiency variation of the apodized phase mask has to be realized by relief depth modulation. The fabrication of such grating structures in photoresist by direct holographic recording with a locally varying exposure energy has been demonstrated in A. Mitreiter et al., "Apodized diffraction grating as outcoupling element for 1.06 µm Nd:YAG laser", OSA Technical Digest Series Vol. 11, Diffractive Optics: Design, Fabrication, and Application, Rochester, 1994, pp. 282–285. The considered apodized grating in this reference relates to reflective output coupling elements in a laser resonator, which is a complete different application from the apodized phase mask. This existing approach for the realization of apodized phase masks presents two major drawbacks. In order to generate the varying modulation depth without distortion, photoresist development and substrate etching with rather linear process characteristics have to be applied. Linear processes are not standard in microfabrication technologies: they are difficult to calibrate, not reproducible and therefore not ideal for production. Furthermore, a linear development and etching process will lead to a sinusoidal surface relief. With the sinusoidal relief in fused silica, the phase mask will only achieve for normal incidence a maximum first-order diffraction efficiency of 30% and have a zero-order contribution. of 15% efficiency. These are poor performances compared to a rectangular surface relief with 40% first-order efficiency and complete extinction of the zero order. The sinusoidal phase mask would require much longer exposure times for the recording of efficient Bragg gratings, and at the same time would modify significantly the average refractive index which results in poor control over the final Bragg wavelength.

Looking to the field of optical elements in general, U.S. Pat. No. 4,936,665 (Whitney) and U.S. Pat. No. 5,587,815 (Sato et al) may finally be mentioned. Whitney discloses high resolution imagery systems and methods including a blazed transmission grating having grating rings of low bending power defined by multiple plateaus. Sato et al discloses a binary phase modulation device provided with protrusions of varying width to generate a diffraction efficiency distribution.

On account of the disadvantages displayed by the existing methods used to fabricate apodized Bragg gratings, there is presently a need for a new fabrication method which will avoid their drawbacks, combine their main advantages, and lead to dramatically improved results in the spectral response of the recorded apodized Bragg gratings.

SUMMARY OF THE INVENTION

An object of the present invention is to propose a phase mask and a method for fabricating a phase mask which will satisfy the above-mentioned needs. More particularly, the present invention concerns a phase mask for modulating a collimated light beam passing therethrough, the light beam being diffracted to photoinduce by self-interference a refractive index profile in a photosensitive optical medium, the phase mask comprising:

a substrate having an outer surface provided with a plurality of parallel grating corrugations, the grating corrugations having a non-uniform relief depth across the outer surface, the phase mask being characterized in that the non-uniform relief depth is maximum at a center of the grating corrugations and decreases continuously to zero at opposite ends of said grating corrugations for photoinducing an apodized refractive index profile in the photosensitive optical medium, the non-uniform relief depth being defined by a variable thin film layer of variable thickness overlaying the substrate.

In a first preferred embodiment of the invention, the grating corrugations comprise a plurality of grooves etched into the variable thin film layer. The substrate may comprise an etch stop layer lying under the variable thin film layer.

In a second preferred embodiment of the invention, the grating corrugations comprise a plurality of grooves etched into the substrate, the variable thin film layer being deposited into the grooves.

Another object of the present invention is to propose a method for making a phase mask having a non-uniform grating profile. A first preferred version of the method comprises steps of:

a) depositing a variable thin film layer having a variable thickness on a substrate;

b) depositing a photoresist layer on the variable thin film layer;

c) recording a grating pattern in the photoresist layer;

d) etching the grating pattern through the photo-resist layer and into the variable thin film layer, the variable thickness of the variable thin film layer generating the non-uniform grating profile; and e) removing residual photoresist remaining on the variable thin film layer.

Another preferred version of the method for making a phase mask according to the present invention comprises steps of:

a) depositing a variable thin film layer having a variable thickness on a uniform phase mask, the uniform phase mask having an outer surface provided with a plurality of uniform parallel grating corrugations, the corrugations defining grooves and ridges so that a portion of the thin film layer is deposited on the ridges and another portion of the thin film layer deposited in the grooves, and b) removing the portion of the variable thin film layer that is deposited on the ridges of the corrugations.

Preferably, this method comprises an additional step of making the uniform phase mask. This additional step comprises steps of:

i) depositing a photoresist layer on a substrate;

ii) recording a grating pattern in the photoresist layer; and iii) etching the grating pattern through the photoresist layer and into the substrate to obtain the grating corrugation.

Also preferably, step b) of this method further comprises removing residual photoresist remaining on the corrugations.

A better understanding of the invention will be obtained by reference to the detailed description below in conjunction with the appended drawings.

DETAILED DESCRIPTION OF THE INVENTION a) Description of Preferred Embodiment of a Phase Mask According to the Invention The present invention concerns a phase mask for modulating a collimated light beam passing therethrough. It is understood that the expression "light beam" is herein referring to electromagnetic radiation of any wavelength, and is not restricted to visible light. Ultra-violet light is a preferred type of radiation to be used with the present invention. The said light beam is devised to photoinduce a non-uniform refractive index profile in a photosensitive optical medium, more particularly to record Bragg gratings having an apodized profile in the core of optical fibers or other waveguides. It is also understood that in the present context, "apodized" refers to a spatially varying diffraction efficiency. Both the phase mask and the produced Bragg grating have a similar apodized profile.

In other words the said light beam is diffracted by the phase mask into a set of diffraction orders with spatially variable diffraction efficiencies to photoinduce a non-uniform refractive index profile in a photosensitive optical medium by self-interference, more particularly to record Bragg gratings in the core of optical fibers or other waveguides having an apodized profile.

Figure 1:
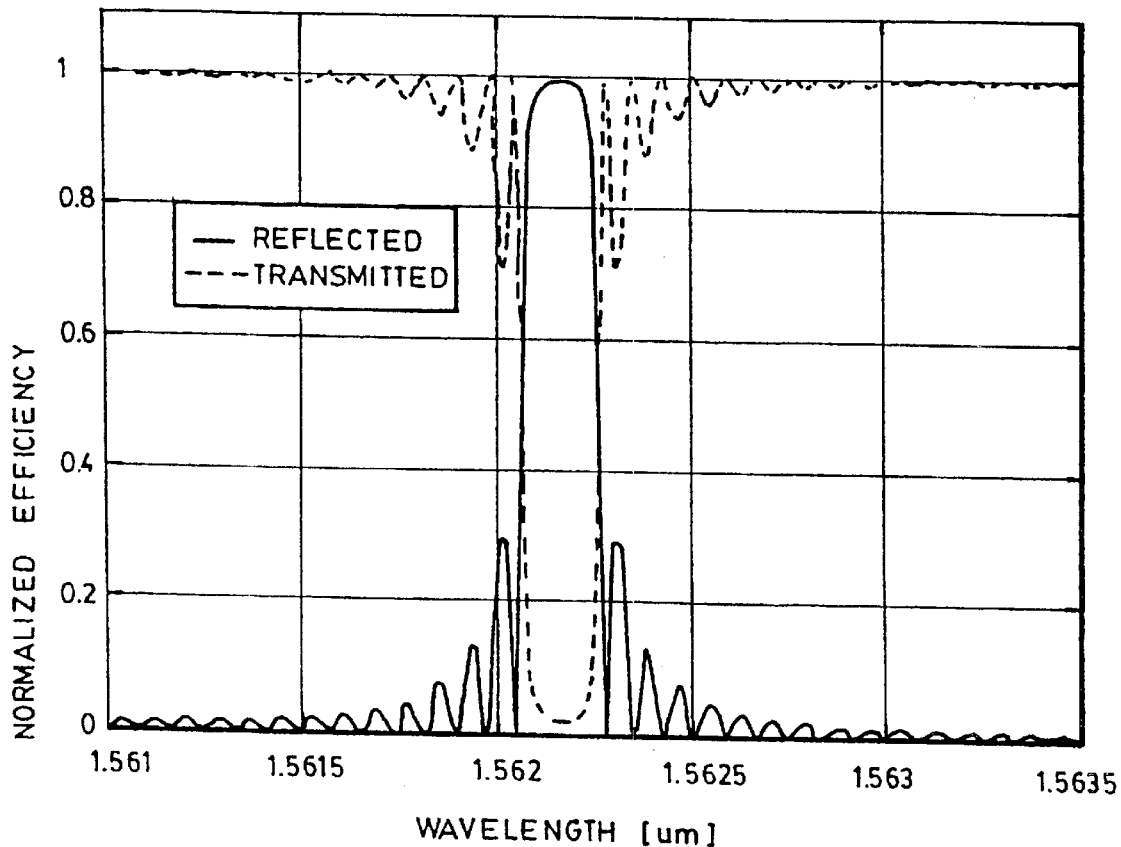
FIG. 1 is the calculated reflectivity spectrum of a Bragg grating of uniform modulation, according to prior art.
Figure 2:
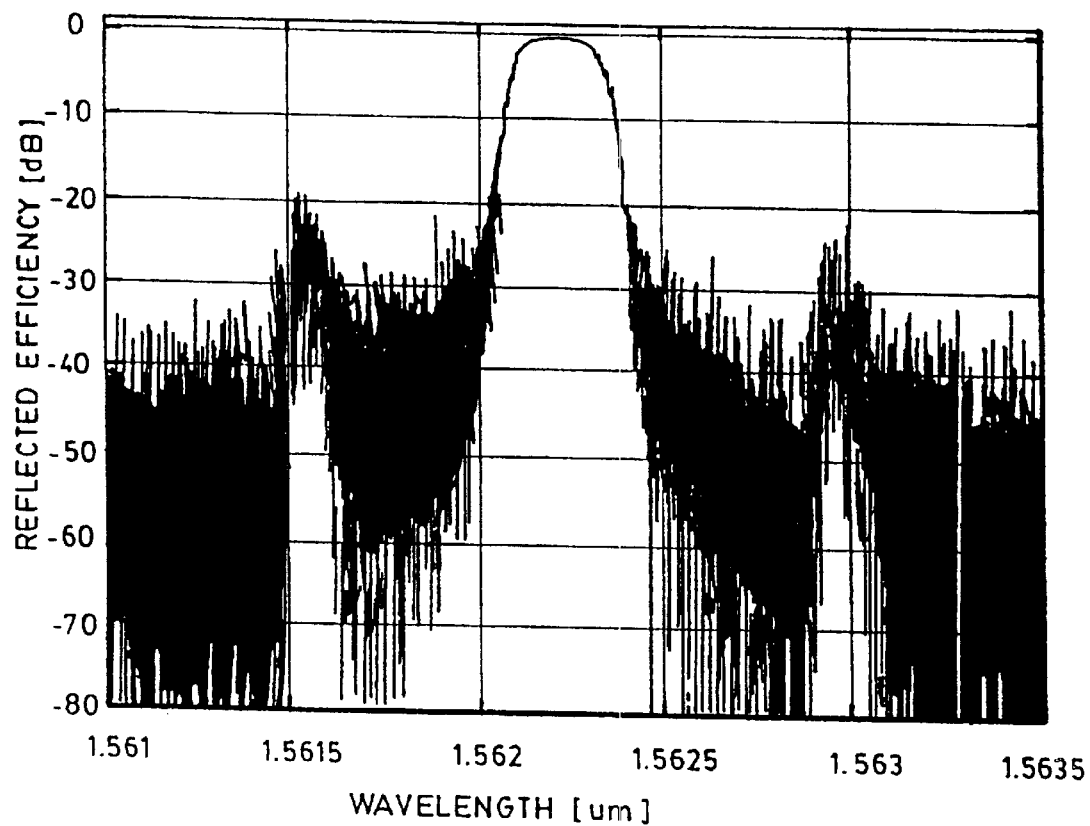
FIG. 2 is the calculated reflectivity spectrum of an apodized Bragg grating realized with a phase mask generated by prior art direct-write technologies, with typical direct-write fabrication errors (systematic field stitching errors and random position errors) considered.
Figure 3:
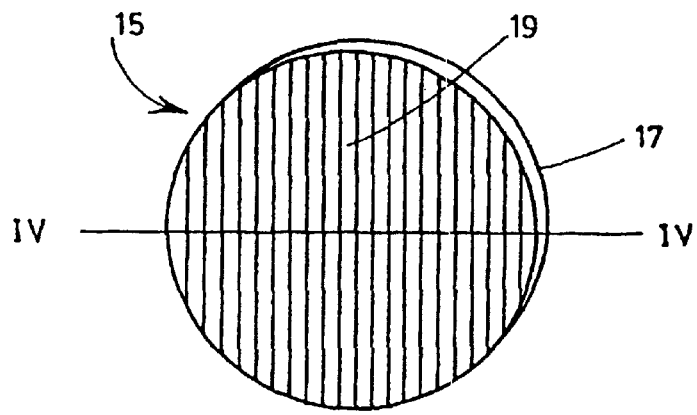
FIG. 3 is a top view of a phase mask according to the present invention.
Figure 4:
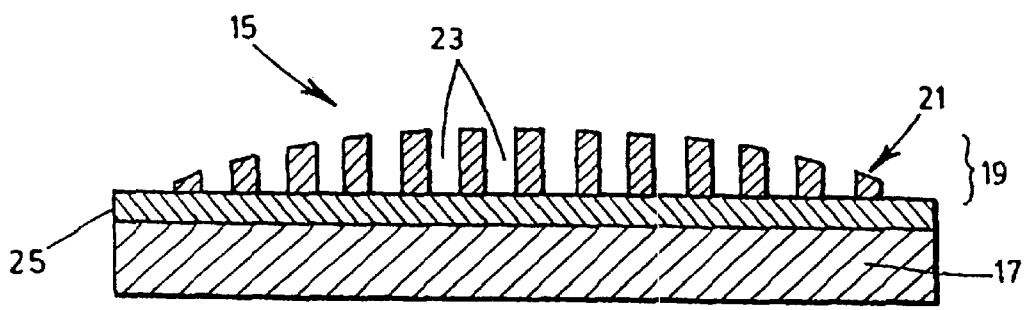
FIG. 4 is a cross-sectional side view along line IV—IV of the phase mask of FIG. 3 illustrating a first preferred embodiment of the present invention.
Figure 5:
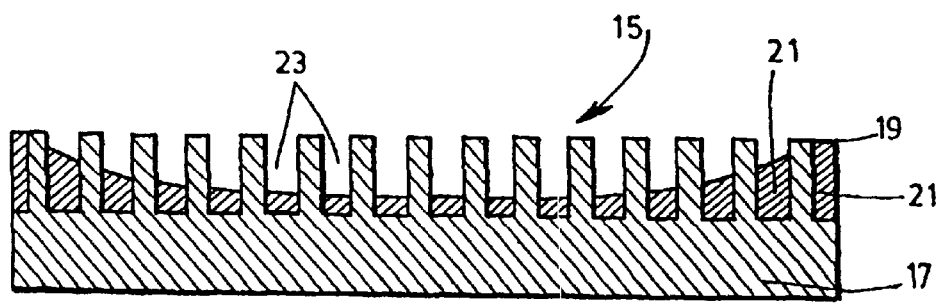
FIG. 5 is a cross-sectional side view along line IV—IV of the phase mask of FIG. 3 illustrating a second preferred embodiment of the present invention.

Referring to FIGS. 3, 4 and 5, the phase mask (15) according to the present invention comprises a substrate (17) having an outer surface provided with a plurality of parallel grating corrugations (19). The grating corrugations (19) have a non-uniform relief depth across the outer surface to generate variable diffractive efficiencies, which is necessary to photoinduce a non-uniform refractive index profile in the photosensitive optical medium. The non-uniform relief depth is defined by a variable thin film layer (21) of variable thickness overlaying the substrate (17).

According to a first preferred embodiment of the present invention, shown in FIG. 4, the grating corrugations (19) of the phase mask (15) comprise a plurality of grooves (23) etched into the variable thin film layer (21). Optionally, in this embodiment the substrate (17) may comprise an etch stop layer (25) lying under the variable thin film layer (21). The purpose of this etch stop layer will be further explained below.

FIG. 5 shows a second -preferred embodiment of the invention, wherein the grating corrugations (19) comprise a plurality of grooves (23) etched directly into the substrate (17) itself, and wherein the variable thin film layer (21) is deposited into said grooves (23).

Figure 6:
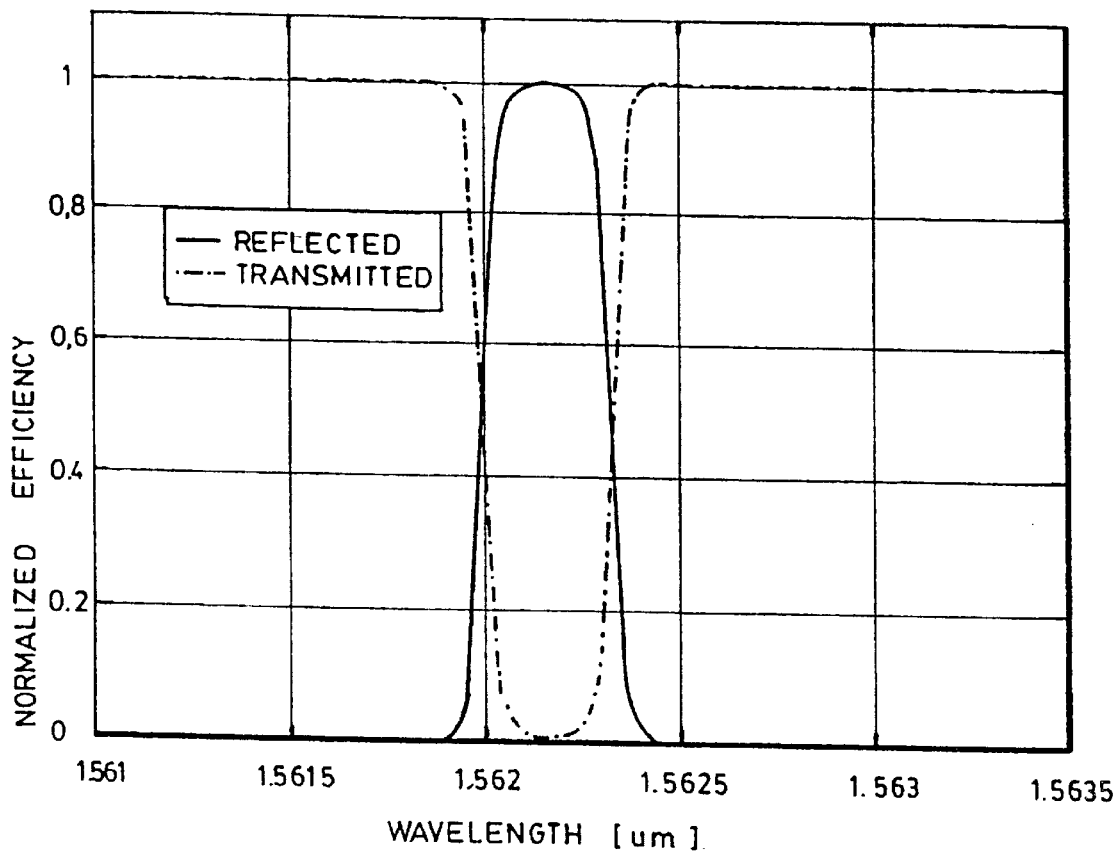
FIG. 6 is the calculated reflectivity spectrum of an apodized Bragg grating with a Gaussian modulation profile.
Figure 9:
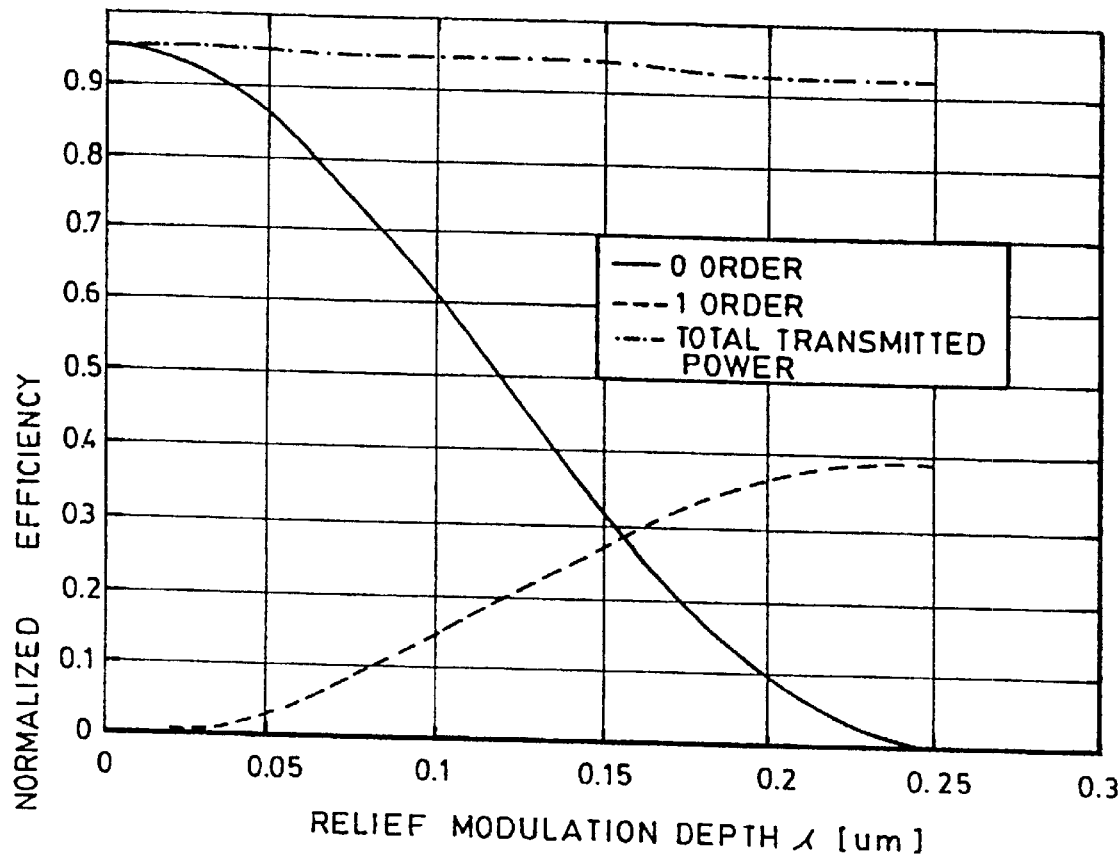
FIG. 9 is a calibration curve appropriate for creating an apodization profile, showing the diffraction efficiency versus the relief depth.

The shape of the variable thin film layer (21) generates the desired local diffraction efficiency, and may be determined from a calibration curve based on electromagnetic grating diffraction theory such as shown in FIG. 9. Preferably, the resulting refractive index profile photoinduced in the optical medium can for example have the shape of a Gaussian, Blackman or Hamming function, or one period of a squared cosine function. The calculated Bragg response of an apodized fiber grating with a Gaussian modulation profile is shown in FIG. 6. The non-uniform relief depth of the grating corrugations (19) is preferably optimized in the center of the phase mask (15) for a minimization of a zero order of diffraction and a maximization of the self-interference of plus and minus first orders of diffraction of the collimated light beam, when said light beam passes through the phase mask (15) at a normal angle of incidence. Another variation could be to optimize the non-uniform relief depth of the grating corrugations (19) for a maximum contrast of the self-interference of a zero order and minus first order of diffraction of the collimated light beam, when said light beam passes through the phase mask (15) at an oblique angle of incidence.

The design of a phase mask begins by analyzing the recording process of the Bragg grating in an optical fiber or waveguide. Generally, a linear relation between the exposure energy and the induced refractive index change is assumed. In this case, the recorded refractive index modulation from the self-interference pattern of a phase mask can be represented by the following equation:

$$n(x) = n_o(x) + \Delta n(x)\cos\left(\frac{2\pi}{P}x\right) + \sum_{l\geq 1} \Delta n_l(x)\cos\left(\frac{2\pi l}{\Lambda}x\right) \quad (1)$$

where x denotes the axis along the apodization profile within the optical fiber or the waveguide, $n_o(x)$ represents the average index of refraction after recording and is proportional to the average recording power during exposure defined by the total transmitted light in FIG. 9. The total transmitted light is independent of the relief depth modulation and generates therefore a constant refractive index in the recording medium. $\Delta n(x)$ is the desired index modulation of the grating formed by the interference of the plus and minus first diffraction orders. The period of this grating is P, which is half of the size of the period $\Lambda$ of the phase mask. After exposure, $\Delta n(x)$ is proportional to the local first order intensity interference pattern. The shape of $\Delta n(x)$ corresponds to the desired apodization profile of the first order diffraction efficiency.

The terms in the sum of equation (1) represent undesired parasitic gratings, which are due to interference between the zero order and higher propagating diffraction orders. Their periods have spatial frequencies which are integer multiples of the spatial frequency of the master phase mask $1/\Lambda$.

Especially, at the border of the phase mask relief depth profile, the zero order and higher diffraction orders are no longer suppressed by the phase mask grating and have to be considered. However, only parasitic gratings with periods equal to $P=\Lambda/2$ influence the reflectivity of the Bragg wavelength. Due to the recording geometry at normal incidence, the fringes formed by the interference of the plus and minus first diffraction orders are perpendicular to the phase mask surf ace and to the core of the optical fiber or waveguide. All other parasitic grating of equal periodicity P are inclined with respect to the core of the optical fiber or waveguide. Since light guided in the core of the waveguide sees an effective refractive index averaged over the diameter of the core and the surrounding media, sufficiently inclined parasitic grating lines will be averaged out upon propagation and have therefore no influence on the reflectivity spectrum. A condition that only the desired grating is efficient is given in Eq. (2).

$$d_c \geq \frac{\lambda}{n}\left(1 - \sqrt{1 - \frac{4\lambda^2}{n_c^2 \Lambda^2}}\right)^{-1}, \quad (2)$$

where $\lambda$ is the wavelength of the recording light in free space, $d_c$ represents the diameter of the core and $n_c$ is the refractive index of the core.

If Eq. (2) is satisfied, the design of the apodized phase mask can be based on a calibration curve considering only the first order diffraction efficiency to generate the desired apodized spectral response profile. In addition, the total transmitted power through the phase mask has to be constant, in order to generate a uniform average refractive index which implies a single Bragg wavelength.

If Eq. (2) is not satisfied, apodized phase masks can be realized, but their design and their operation is considerably more difficult. Since parasitic gratings are not averaged out, they have to be taken into account for the calibration curve. For the design, the rigorous interference pattern has to be computed inside the waveguide core and averaged over the core diameter. Then, the calibration curve is obtained from the Fourier coefficient corresponding to the desired spatial frequency of the averaged interference pattern. Again, it is necessary to check for a constant average recording power. Note also, that in this case, the average interference pattern in the waveguide core depends on the distance separating the waveguide core and the phase mask grating surface. Therefore, the calibration curve depends on this separation and for the Bragg grating recording, the fiber has to be accurately aligned with respect to a reference position. This is difficult to achieve in practice.

Standard monomode telecommunication optical fibers satisfy Eq. (2) and therefore the design of the apodized phase mask should consider only the diffraction efficiencies of the local grating structure.

b) Description of Preferred Methods of Making a Phase Mask According to the Invention The present invention also proposes a method for making a phase mask (15) having a non-uniform relief depth as shown in FIGS. 4 and 5.

Figure 7A:
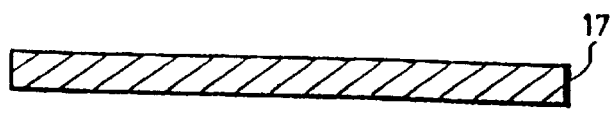
FIGS. 7A to 7F illustrate the fabrication steps of the phase mask shown in FIG. 4.
Figure 7B:
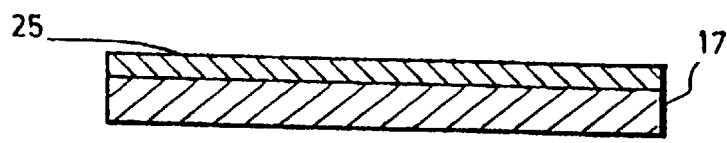
Figure 7C:
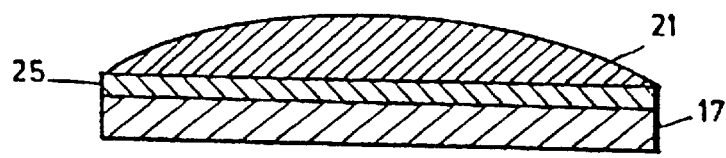
Figure 7D:
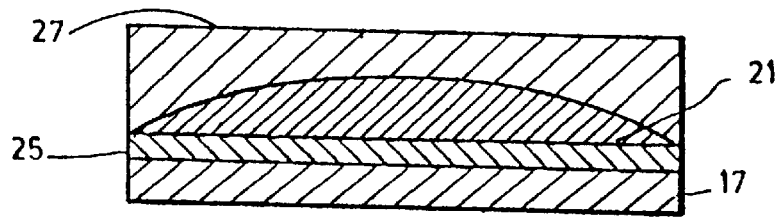

FIGS. 7A to 7F illustrates the sequence of steps for making a phase mask (15) as shown in FIG. 4. The preferred version of a method according to the present invention comprises a first step a) of depositing a variable thin film layer (21) having a variable thickness on a substrate (17). FIG. 7A shows the substrate (17). The materials chosen to compose the substrate (17) and the variable thin film layer (21) are preferably transparent to UV light. Potential candidates, besides others, are fused silica or quartz ($SiO_2$), magnesium fluoride ($MgF_2$), and calcium fluoride ($CaF_2$). In addition, the substrate (17) is preferably made of a material that can act as an etch stop for the later etching process of the variable thin film layer (21). Alternatively, an etch stop layer (25) may be deposited on the substrate (17) prior to step a). In this case, the material composing the etch stop layer (25) is also chosen to be transparent to UV light. The result of this-optional step can be seen in FIG. 7B. In a preferred realization of this embodiment, the variable thin film layer (25) is made of $SiO_2$ and the substrate (17) or the etch stop layer (25) are made of $MgF_2$ or $CaF_2$. Since high quality bulk substrates of $MgF_2$ or $CaF_2$ are expensive, it is interesting to use a fused silica substrate (17) and apply an etch stop layer (25) of $MgF_2$ or $CaF_2$ on it.

Different approaches can be considered to generate a variable thin film layer (21) having a variable thickness. A straightforward approach is to structure a previously deposited uniform thin film layer. This can be achieved by polishing, diamond turning, laser ablation or any other technique. However, in order to achieve high damage threshold for the readout laser power, the preferred technique is direct deposition of the variable thickness thin film through a carefully chosen aperture or mask, as described in the Canadian Patent No. 1,298,724 by Lavigne et al. In this technique, a deposition mask having an aperture of predetermined contour is placed over the substrate (17). The variable thin film layer (21) is deposited through this aperture, and its thickness is varied by either rotating the deposition mask with respect to the substrate, or rotating the substrate with respect to the deposition mask. Another variation of this technique is to place a deposition mask having an aperture of predetermined contour over the substrate at a predetermined distance from the deposition mask. Then, the variable thin film layer (21) is deposited through the aperture of the deposition mask, the thickness of the variable thin film layer (21) being determined by the predetermined contour of the aperture and the predetermine distance of the deposition mask. A further variation of this technique is to chose a deposition mask having a variable deposition aperture, and vary this aperture in the deposition process to modulate the thickness of the deposited layer. More appropriate asymmetric two-dimensional profiles can be obtained, if the deposition is made through a fixed aperture at a given distance (see R. Grunwald et al., "Microlens arrays formed by crossed thin-film deposition of cylindrical microlenses", OSA Technical Digest Series Vol. 5, Diffractive and micro-optics, Boston, 1996, pp. 27–30). Since the variable thin film layer (21) will be etched, good adhesion to the substrate (17) is crucial and can be achieved by applying ion plating as deposition technology. It is worth noting that these deposition methods lead to very reproducible results and are suited for batch processes. The deposited variable thin film layer (21) can be seen in FIG. 7C.

A second step of the fabrication of the phase mask shown in FIG. 4 is to b) deposit a photoresist layer (27) on the variable thin film layer (21). The result can be seen in FIG. 7D. The photoresist layer (27) is preferably deposited by spin coating over the variable thin film layer (21). Since typical phase mask geometries for in-fiber Bragg gratings require a maximum thickness variation of approximately 250 nm and apodization profiles of several millimeters in width, the local thickness variation is negligible and does not influence the spin coating process.

Figure 7E:
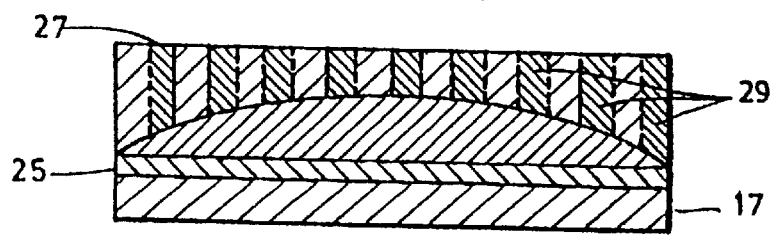

Referring to FIG. 7E, the method comprises a third step c) of recording a grating pattern (29) in the photoresist layer (27). This is preferably accomplished holographically by standard exposure of the photoresist (27) to a uniform interference pattern. Preferably, exposure and development parameters are chosen to produce an optimized and uniform line width of the grating corrugations (19) over the grating surface. The recording of the grating pattern (29) can also be performed by direct writing with a focused electron or ion beam, or any other appropriate technique known in the art.

The method further comprises a step d) of etching the grating pattern (29) through the photoresist layer (27) and into the variable thin film layer (21). The substrate or the etch-stop layer acts as an etch-stop at the phase mask borders. By anisotropic reactive ion etching, the grating pattern (29) is transferred only in the variable thin film layer (21) without affecting the line width, that is the width of the grating corrugations.

The method also comprises a step e) of removing residual photoresist (27) remaining on the variable thin film layer (17).

Figure 7F:
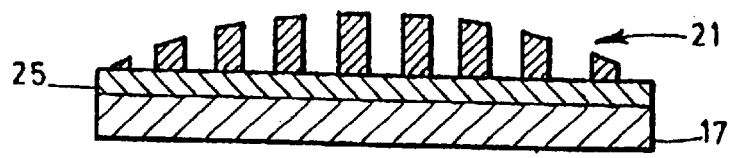

FIG. 7F shows the phase mask (15) produced by the above-described method.

The advantages of this method are numerous: an easy standard recording process is used, a standard binary etch step generates a rectangular relief of constant line width and a well controlled relief depth modulation enabling a suppressed zero order in the phase mask center, high first order efficiency and a minimized sensitivity to the polarization state of the incident light. Moreover the Bragg grating response will be free of background noise and sidelobes. The method according to the present invention is simple to perform, and gives very good results compared to prior art methods.

Figure 8A:
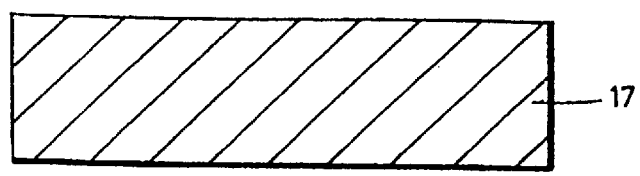
FIGS. 8A to 8F illustrate the fabrication steps of the phase mask shown in FIG. 5.
Figure 8B:
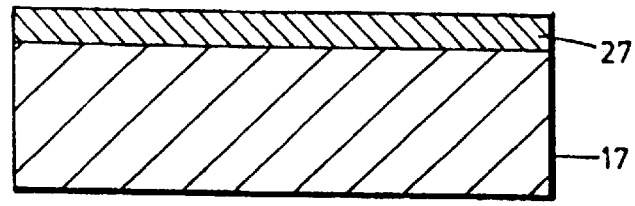
Figure 8C:
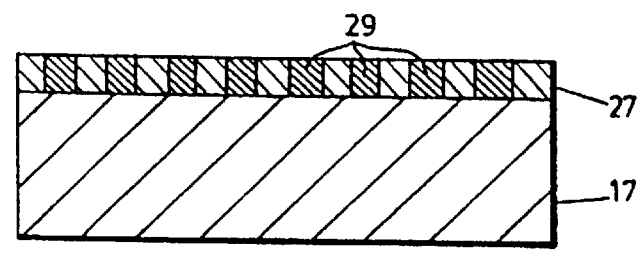
Figure 8D:
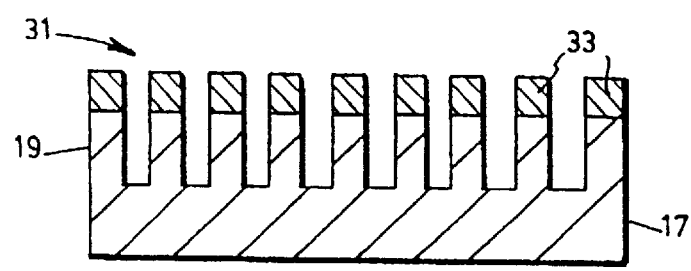

A second preferred version of the method according to the present invention is proposed to realize a non-uniform phase mask (15), as shown in FIG. 5. The steps of this second method are illustrated in FIGS. 8A to 8F. It comprises a general step of depositing a variable thin film layer (21) having a variable thickness on a uniform phase mask (31), the uniform phase mask (31) having an outer surface provided with a plurality of uniform parallel grating corrugations (19). By uniform parallel grating it is meant that the grooves (23) have all the same depth. The uniform phase mask is preferably made by first depositing a photoresist layer (27) on a substrate (17), as shown in FIGS. 8A and 8B, and then recording a grating pattern (29) in the photoresist layer (27), as shown in FIG. 8C. The grating pattern (29) is finally etched through the photoresist layer (27) and into the substrate (17), to obtain the grating corrugations (19) as shown in FIG. 8D. The above-described techniques of depositing, grating recording and etching can also be applied in this case.

Figure 8E:
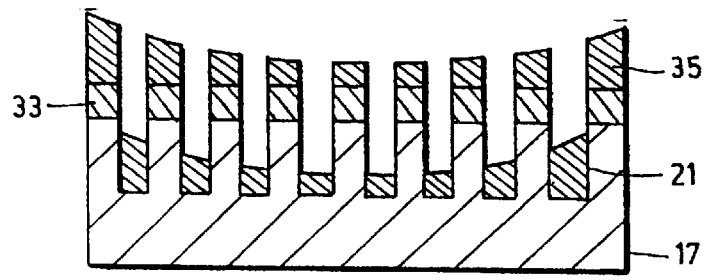
Figure 8F:
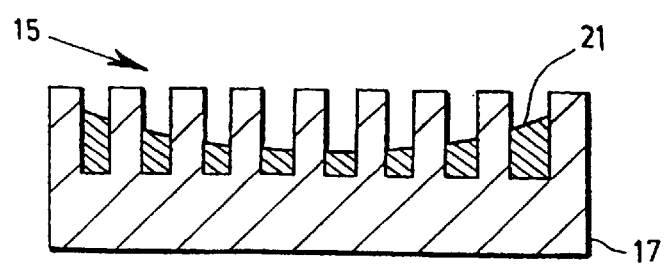

In this approach, remaining photoresist (33) is kept on the grating corrugations (19) after etching, as illustrated in FIG. 8D. Then, the variable thin film layer (21) is deposited over the etched grating structure, as shown in FIG. 8E. The refractive index of the thin film material is preferably closely matched to the index of the substrate (17), in order to eliminate residual diffraction in the deposited regions. After the deposition, the remaining photoresist (33) and the material deposited thereon (35) are lifted off using an oxygen plasma or an alternative technique. The result is a diffraction grating of variable relief depth as schematically shown in FIGS. 5 and 8F. The relief depth variation generating the desired apodization profile is obtained from a calibration curve based on electromagnetic grating theory similar to the one shown in FIG. 9. Compared to the previous approach, an apodized phase mask of similar optical performances can be realized. However, since in this approach the variable thin film layer (21) is not etched, improved adhesion and robustness is achieved.

It may be added that the apodized phase masks (15) fabricated with the proposed methods are easily identifiable to the naked eye. The relief depth modulation of the apodized phase mask (15) can also be visualized by scanning with an atomic force microscope (AFM). The application of a variable thin film layer (21) of variable thickness becomes visible by effectuating a slice through the phase mask structure and examining the cross section in a scanning electron microscope (SEM).

When using the above described phase mask for recording an apodized Bragg grating in an optical medium with a single exposure, problems due to small variations of the recorded average refractive index may appear. These fluctuations of the average refractive index are due to either a non-uniform intensity profile of the readout beam or a variation of the total transmitted power through the phase mask (15). Preferentially, these effects can be eliminated by use of an additional intensity apodizing filter in the recording beam. In order to enable a general application, this intensity apodizing filter is specially designed to introduce small random intensity variations to the uniform intensity profile of the incident beam.

These intensity fluctuations compensate local variations of the average recorded refractive index of the Bragg grating, which can produce important Fabry-Perot sidelobes using the random apodizing filter. Such sidelobes can be eliminated and changed to random noise of negligible amplitude.

A preferential embodiment of the intensity apodizer is a diffraction grating with a binary surface relief and a locally varying line-width or fill factor. The design and fabrication of such an element is described in M. Plante, C. Pare, P. A. Belanger, Y. Champagne, J. M. Trudeau,. M. Morin and P. Ehbets, "Laser beam variance measurements using a parabolic transmission filter", SPIE vol. 2870, pp. 22–30 (1996).

With the new fabrication technique described herein, a phase mask of rectangular surface relief grating shape with variable relief depth has been realized with high precision. The line width is constant over the whole grating surface and is chosen in order to enable in the center of the apodization profile a maximum contrast of the recording interference fringes. Electromagnetic grating theory has shown that this is achieved with a line width (or fill factor) of 0.45 of the grating period for a phase mask etched in a $SiO_2$ thin film or any other dielectric layer of similar index of refraction.

FIG. 9 shows the dependence of first and zero order diffraction efficiencies as a function of the relief depth. Phase mask parameters are chosen to realize a Bragg in-fiber grating with a Bragg wavelength in the telecommunication window around 1550 nm. Optimum line width of 0.45 and readout with a nonpolarized excimer laser at wavelength $\lambda=248$ nm is considered. The phase mask grating structure is etched in a variable thickness thin film layer of $SiO_2$ deposited over a uniform $MgF_2$ film, acting as an etch stop, on a fused silica substrate. The variable relief depth produces a smooth dependence of the first order diffraction efficiency, which is well adapted for the encoding of the desired apodization profile. Electromagnetic analysis has shown that the relief depth modulation is less sensitive to the polarization state of the readout laser compared to a modulation of the line width as achieved with direct writing. Therefore, apodized phase masks achieved with the new technology can be used with a broader range of illumination sources. It is further observed that the total transmitted power through the mask is practically independent of the relief depth.

Electromagnetic analysis has also revealed that in this geometry the first order diffraction efficiency in transmission is essentially independent of the thickness of the etch stop layer. This thin film influences more the reflectivity and therefore, its thickness is preferably chosen to minimize reflectivity variations at the holographic recording in photoresist. In a realized prototype a $MgF_2$ film thickness of 100 nm has been chosen, but a layer of a different material or thickness may equally be applied.

Figure 10:
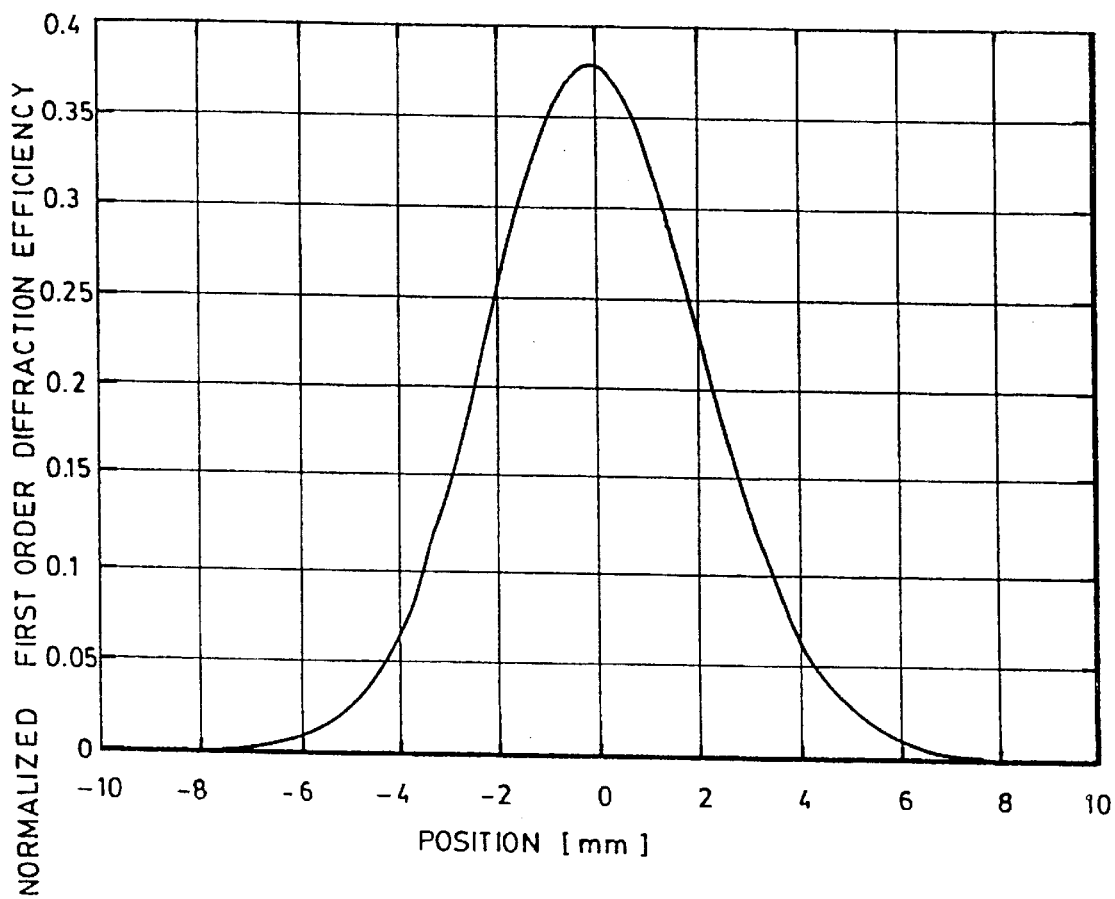
FIG. 10 is a graph showing the spatial first order efficiency variation for a Gaussian apodization profile of FWHM=5 mm.
Figure 11:
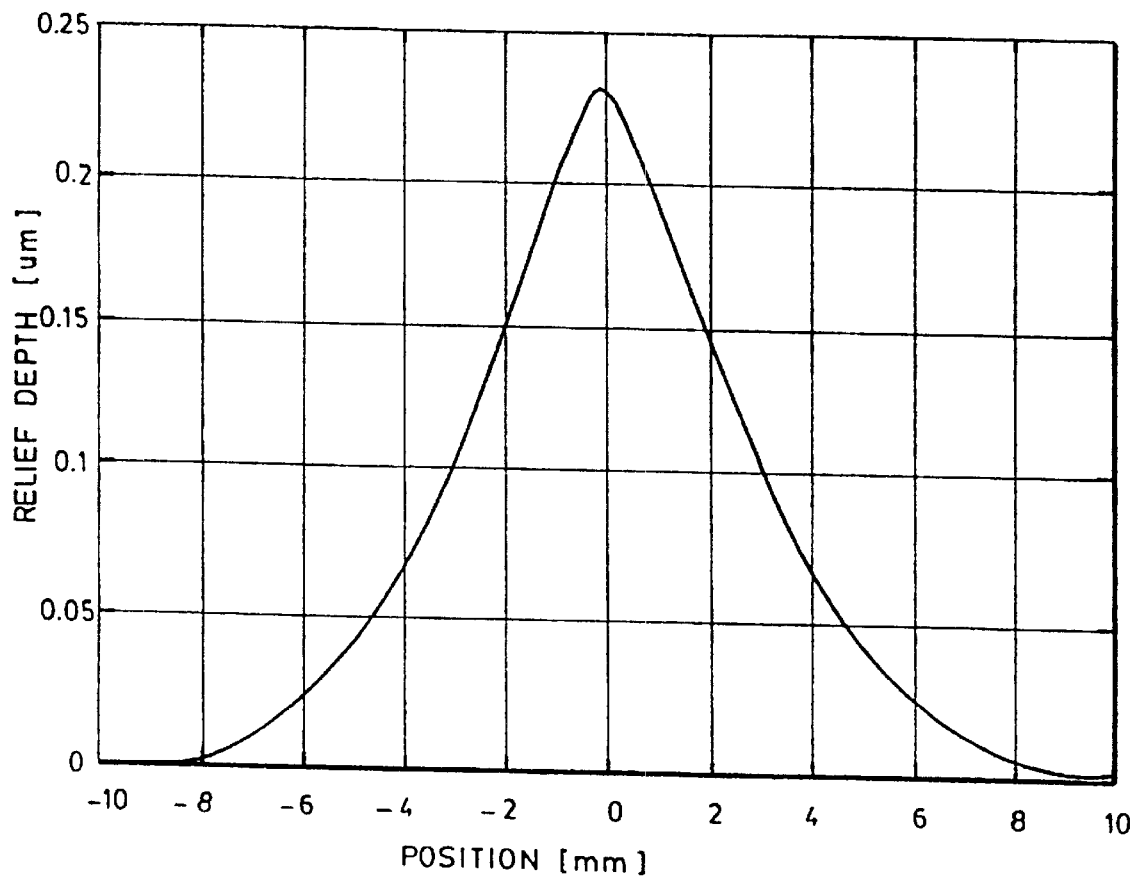
FIG. 11 is a graph showing the calculated phase mask relief depth versus position corresponding to the apodization profile of FIG. 10 and calculated from the calibration curve shown in FIG. 9.

A prototype apodized phase mask with a variable thin film gaussian profile of full width at half maximum (FWHM)=5 mm have been realized, using the fabrication method illustrated in FIG. 7. This apodization profile is shown in FIG. 10. Using the calibration curve of FIG. 9, the corresponding thickness variation of the variable thin film layer ($SiO_2$) has been computed and is shown in FIG. 11.

Figure 12:
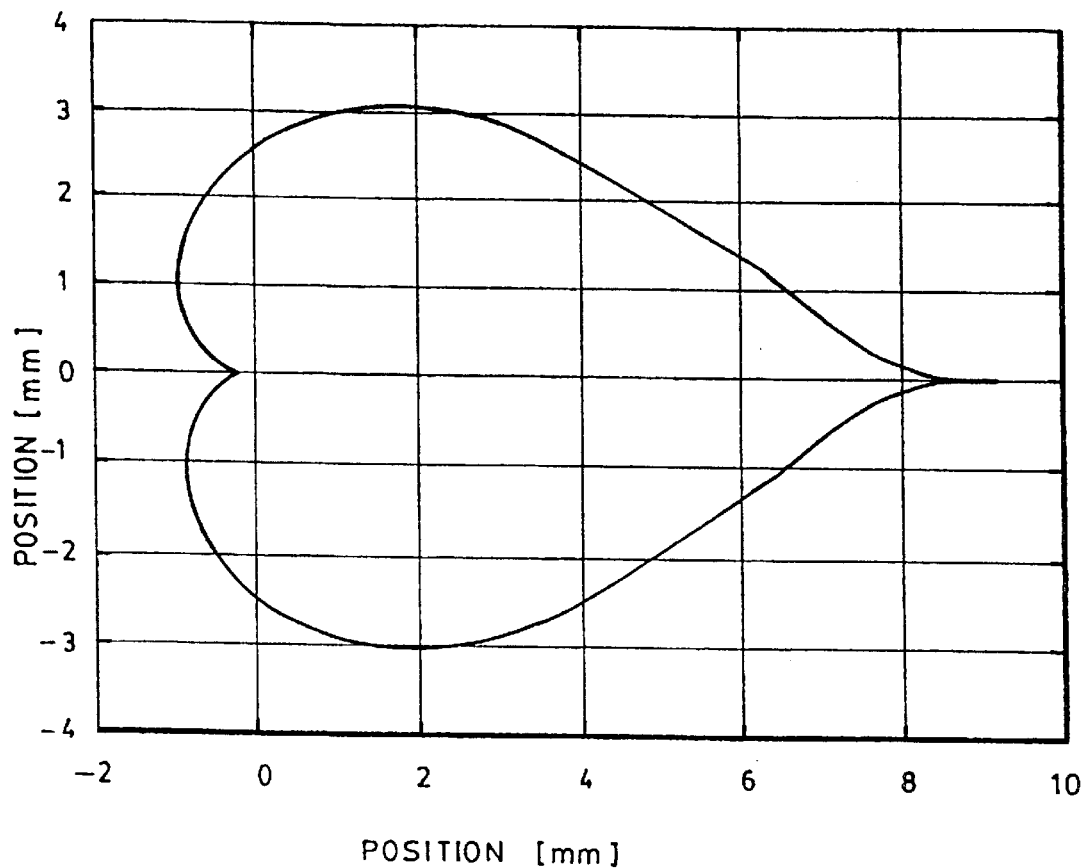
FIG. 12 is a graph showing the shape of the aperture of a rotating deposition mask for radial symmetry, generating the relief depth profile in FIG. 11.

In this prototype, the variable thin film layer has been fabricated by deposition through an aperture, as described in the above-mentioned Canadian patent by Lavigne et al. For ease of prototype fabrication, a radial symmetric profile has been realized by deposition through a rotating deposition mask in close proximity to the substrate. This fabrication technology generates the desired tickness variation profile along a cross-section through the center of the substrate. The shape of the required deposition mask is shown in FIG. 12. More general two-dimensional apodization profiles are more appropriate for phase mask applications. Such geometries can be achieved by material deposition through a fixed deposition mask at a well defined distance from the substrate, as it is described in the reference by R. Grunwald et al., "Microlens arrays formed by crossed thin-film deposition of cylindrical microlenses", OSA Technical Digest Series Vol. 5, Diffractive and micro-optics, Boston, 1996, pp. 27–30. Preferably, in order to achieve a good adhesion of the thin films, ion plating is applied as deposition technology.

Variable thickness thin film deposition enables a high accuracy and a high reproducibility of the desired film thickness profile. Since the fabrication technology can be applied as a batch process, it is well suited for the production of apodized phase masks.

Standard holographic recording was applied to record a uniform grating in photoresist. The exposure and development parameters are adjusted to generate the optimum grating line width of 0.45. Selective reactive ion etching of $SiO_2$ is then applied to etch the photoresist grating through the variable thin film layer. This selective process shows a very low etching rate of the $MgF_2$ layer that acts as an etch stop, the etch depth is well controlled, thus resulting in optimum phase mask performance.

Figure 13:
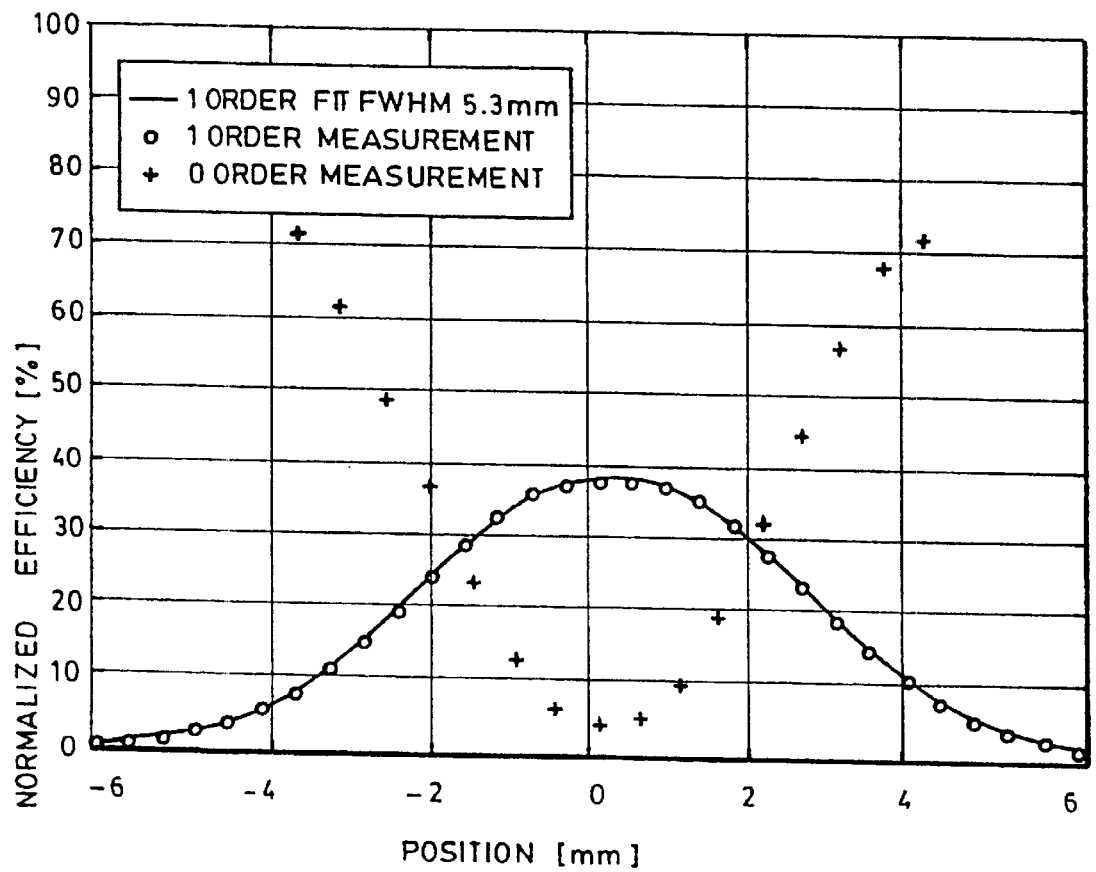
FIG. 13 is a graph showing the optical characterization of a realized prototype apodized phase mask having the geometry shown in FIG. 4.

Measured first order diffraction efficiencies of fabricated prototype phase masks are shown in FIG. 13. It is observed that the prototype phase mask generates the desired Gaussian first order apodization profile. A FWHM of 5.3 mm has been measured, which is close to the design value. A small increase of the FWHM is explained by the efficiency measurement with an optical spot of 2.0 mm diameter. Maximum first order efficiencies in the center is 37% and the zero order was suppressed below 3%. The given efficiency values are measured with respect to the incident beam power on the grating. They contain any reflection or absorption losses. Compared to previously achieved results with direct writing, a much higher modulation range of the first-order diffraction efficiency is demonstrated.

Damage threshold of the apodized phase mask has been tested with a pulsed Nd-Yag laser at $\lambda=1.064$ μm. The prototype masks have resisted to pulses of energy levels up to 13 $J/cm^2$ without deterioration. Adhesion of the etched grating structure has been verified and complies with military specification MIL-C-48497A paragraph 3.4.1.1.

Although preferred embodiments of the invention have been described in detail herein and illustrated in the accompanying drawings, it is to be understood that the invention is not limited to these precise embodiments and that various changes and modifications may be effected therein without departing from the scope or spirit of the invention.

What is claimed is:

1. A phase mask (15) for modulating a collimated light beam passing therethrough, the light beam being diffracted to photoinduce by self-interference a refractive index profile in a photosensitive optical medium, the phase mask comprising:
a substrate (17) having an outer surface provided with a plurality of parallel grating corrugations (19), the grating corrugations (19) having a non-uniform relief depth across the outer surface, the phase mask (15) being characterized in that the non-uniform relief depth is maximum at a center of the grating corrugations and decreases continuously to zero at opposite ends of said grating corrugations for photoinducing an apodized refractive index profile in the photosensitive optical medium, the non-uniform relief depth being defined by a variable thin film layer (21) of variable thickness overlaying the substrate (17).

2. A phase mask (15) according to claim 1, characterized in that the grating corrugations (19) comprise a plurality of grooves (23) etched into the variable thin film layer (21).

3. A phase mask (15) according to claim 2, characterized in that the substrate (17) comprises an etch stop layer (25) lying under the variable thin film layer (21).

4. A phase mask (15) according to claim 1, characterized in that the grating corrugations (19) comprise a plurality of grooves etched into the substrate (17) and wherein the variable thin film layer (21) is deposited into said grooves (23).

5. A phase mask (15) according to claim 1, characterized in that the non-uniform relief depth is shaped so as to photoinduce a refractive index profile in the photosensitive optical medium that has a shape that is defined by a function selected from a group consisting of Gaussian, Blackman and Hamming functions and one period of a squared cosine or sine function.

6. A phase mask (15) according to claim 1, characterized in that the non-uniform relief depth of the grating corrugations is optimized for a minimization of a zero order of diffraction and a maximum contrast of a self-interference of plus and minus first.orders of diffraction of the collimated light beam in a center of the grating corrugations (19) when said light beam passes through the phase mask at a normal angle of incidence.

7. A phase mask (15) according to claim 1, characterized in that the non-uniform relief depth of the grating corrugations is optimized for maximum contrast of a self-interference of a zero order and minus first order of diffraction of the collimated light beam when said light beam passes through the phase mask at an oblique angle of incidence.

* * * * *